(12) United States Patent
He et al.

(10) Patent No.: US 7,746,645 B2
(45) Date of Patent: Jun. 29, 2010

(54) HEAT SINK ASSEMBLY HAVING A CLIP

(75) Inventors: Xiang-Yang He, Shenzhen (CN); Jing Zhang, Shenzhen (CN)

(73) Assignees: Fu Zhun Precision Industry (Shen Zhen) Co., Ltd., Shenzhen, Guangdong Province (CN); Foxconn Technology Co., Ltd., Tu-Cheng, Taipei Hsien (TW)

( * ) Notice: Subject to any disclaimer, the term of this patent is extended or adjusted under 35 U.S.C. 154(b) by 71 days.

(21) Appl. No.: 12/241,065

(22) Filed: Sep. 30, 2008

(65) Prior Publication Data

US 2010/0002396 A1    Jan. 7, 2010

(30) Foreign Application Priority Data

Jul. 4, 2008    (CN) .................... 2008 1 0068329

(51) Int. Cl.
    *H05K 7/20*    (2006.01)
(52) U.S. Cl. .................. 361/709; 361/679.54; 361/704; 361/719; 165/80.3; 165/185; 257/718; 257/719; 248/510; 24/457; 174/16.3
(58) Field of Classification Search ............ 361/679.46, 361/679.54, 704–712, 715, 719, 720–727; 165/80.2, 80.3, 80.4, 80.5, 104.33, 104.34, 165/185; 257/706–727; 174/15.1, 16.3, 174/252; 29/890.02, 890.03, 832, 592.1; 24/453, 457, 458, 625, 588, 589, 981; 248/316.7, 248/505, 506, 510; 411/511, 516, 520, 522, 411/530

See application file for complete search history.

(56) References Cited

U.S. PATENT DOCUMENTS

| | | | | |
|---|---|---|---|---|
| 5,448,449 A | * | 9/1995 | Bright et al. | 361/704 |
| 5,734,556 A | * | 3/1998 | Saneinejad et al. | 361/719 |
| 6,510,054 B1 | * | 1/2003 | Chen | 361/704 |
| 6,644,387 B1 | * | 11/2003 | Lee et al. | 165/80.3 |
| 6,785,136 B2 | * | 8/2004 | Chang et al. | 361/704 |
| 6,822,869 B2 | * | 11/2004 | Huang et al. | 361/704 |
| 7,382,622 B2 | * | 6/2008 | Li et al. | 361/719 |
| 7,515,419 B2 | * | 4/2009 | Li et al. | 361/704 |

\* cited by examiner

*Primary Examiner*—Michael V Datskovskiy
(74) *Attorney, Agent, or Firm*—Frank R. Niranjan

(57) ABSTRACT

A heat sink assembly includes a heat sink and a clip assembly. The clip assembly includes a clip and a pair of movable fasteners pivotally connected to the clip. The clip includes a main body, two pressing portions extending from two opposite ends of the main body and two locking arms extending oppositely from the two pressing portions, respectively. The movable fasteners each include a main body, a pair of receiving portions curved upwardly from the main body and receiving a corresponding locking arm therein and a hook extending downwardly from the main body and engaging with a clasp on a printed circuit board. A distance from each of the hooks of the movable fasteners to a corresponding clasp can be adjustable via rotation of the movable fasteners around the locking arms of the clip.

11 Claims, 4 Drawing Sheets

HEAT SINK ASSEMBLY HAVING A CLIP

BACKGROUND OF THE INVENTION

1. Field of the Invention

The present invention relates to a heat sink assembly, and more particularly to a heat sink assembly having a clip which can firmly secure a heat sink to a heat-generating component such as a central processing unit (CPU) mounted on a printed circuit board.

2. Description of Related Art

It is widely acknowledged that heat is produced during operations of electronic devices such as central processing units (CPUs). The produced heat must be quickly removed to ensure the CPUs working normally. Typically, a heat sink is disposed on the CPU mounted on the printed circuit board to dissipate the heat therefrom.

Typically, linear-type clips were widely used for securing of heat sinks. A linear-type clip, which is integrally made from a resilient metal wire, generally includes an elongated central pressing portion and a pair of locking arms extending from opposite ends of the elongated central pressing portion in opposite directions to thereby form a Z-shaped configuration. When assembled, the elongated central pressing portion of the clip abuts against a base of a heat sink, and the locking arms thereof are then resiliently pressed downwardly to engage with clasps provided on the printed circuit board to thereby secure the heat sink to the CPU.

However, in operation, the locking arms of the clip usually fail to have an appropriate length for properly engaging with the clasps formed on the printed circuit board, whereby the pressing portion cannot firmly press the heat sink toward the printed circuit board to enable the heat sink to have an intimate contact with the CPU. The length of the locking arms of the clip is either too long to easily disengage from the clasps on the printed circuit board when the clip is suffered vibration, or too short to become difficult to engage with the clasps on the printed circuit board.

What is needed, therefore, is a heat sink assembly having a heat sink and a clip securing the heat sink to an electronic device, wherein the clip has an improved structure so that the clip can firmly and accurately secure with clasps on a printed circuit board thereby to enable the heat sink to have an intimate contact with the electronic device.

SUMMARY OF THE INVENTION

A heat sink assembly includes a heat sink and a clip assembly. The clip assembly includes a clip and a pair of movable fasteners pivotally connected to two opposite ends of the clip. The clip includes a main body, two pressing portions extending outwardly from two opposite ends of the main body and two locking arms extending oppositely from the two pressing portions, respectively. The movable fasteners each includes a main body, a pair of receiving portions curved upwardly from the main body and receiving a corresponding locking arm therein and a hook extending downwardly from the main body and engaging with a clasp on a printed circuit board. By the pivotably movable fasteners the clip assembly can accurately and easily engage with the clasps to enable the pressing portions to exert sufficient pressing force on the heat sink so that the heat sink can have an intimate contact with an electronic component on the printed circuit. Furthermore, by the pivotably movable fasteners, the disengagement of the clip assembly from the printed circuit board can also be easily achieved.

Other advantages and novel features will become more apparent from the following detailed description of preferred embodiments when taken in conjunction with the accompanying drawings.

BRIEF DESCRIPTION OF THE DRAWINGS

Many aspects of the present embodiments can be better understood with reference to the following drawings. The components in the drawings are not necessarily drawn to scale, the emphasis instead being placed upon clearly illustrating the principles of the present embodiments. Moreover, in the drawings, like reference numerals designate corresponding parts throughout the several views.

DETAILED DESCRIPTION OF THE INVENTION

Figure 1:
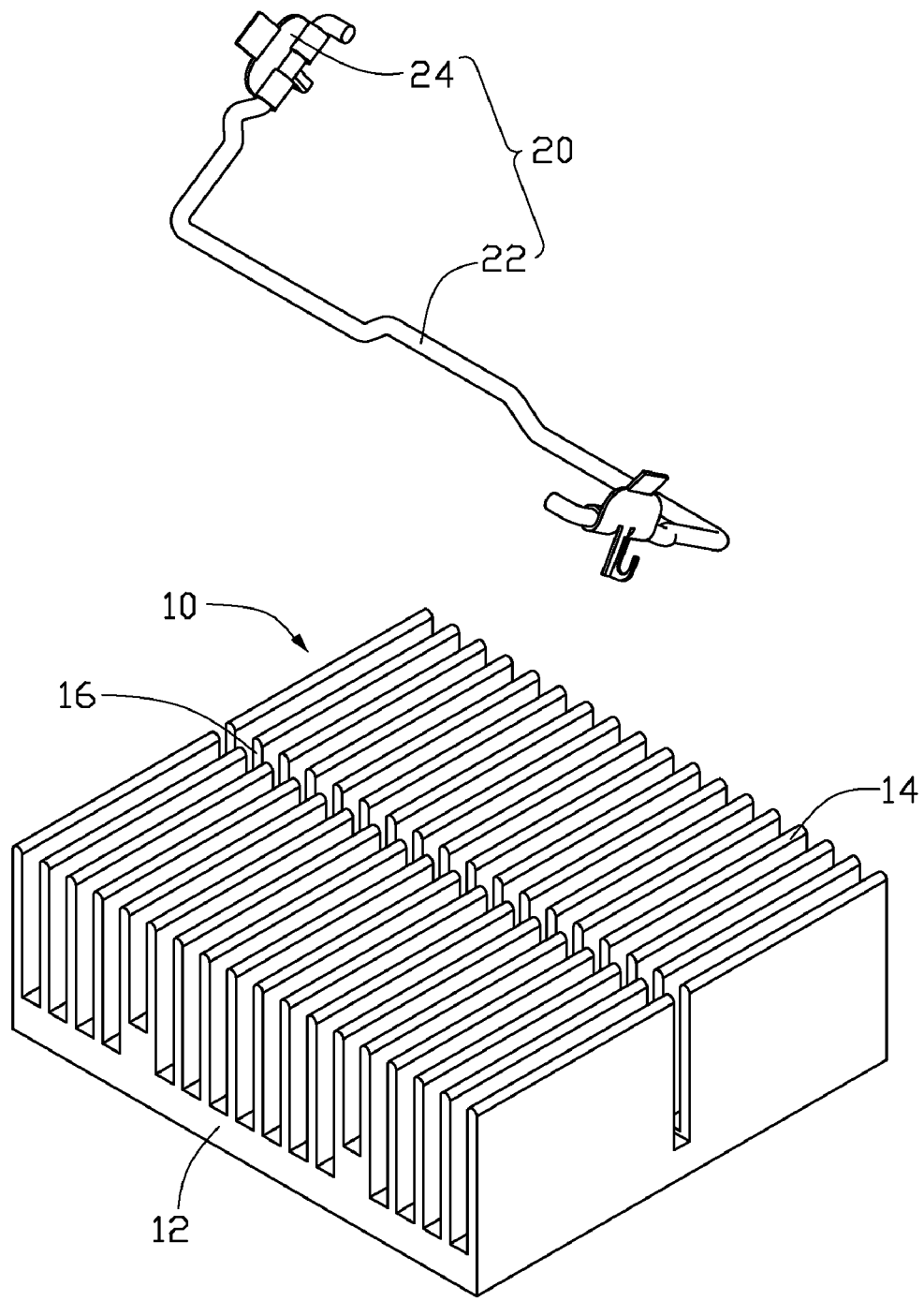
FIG. 1 is an isometric, exploded view of a heat sink assembly in accordance with a preferred embodiment of the present invention.
Figure 2:
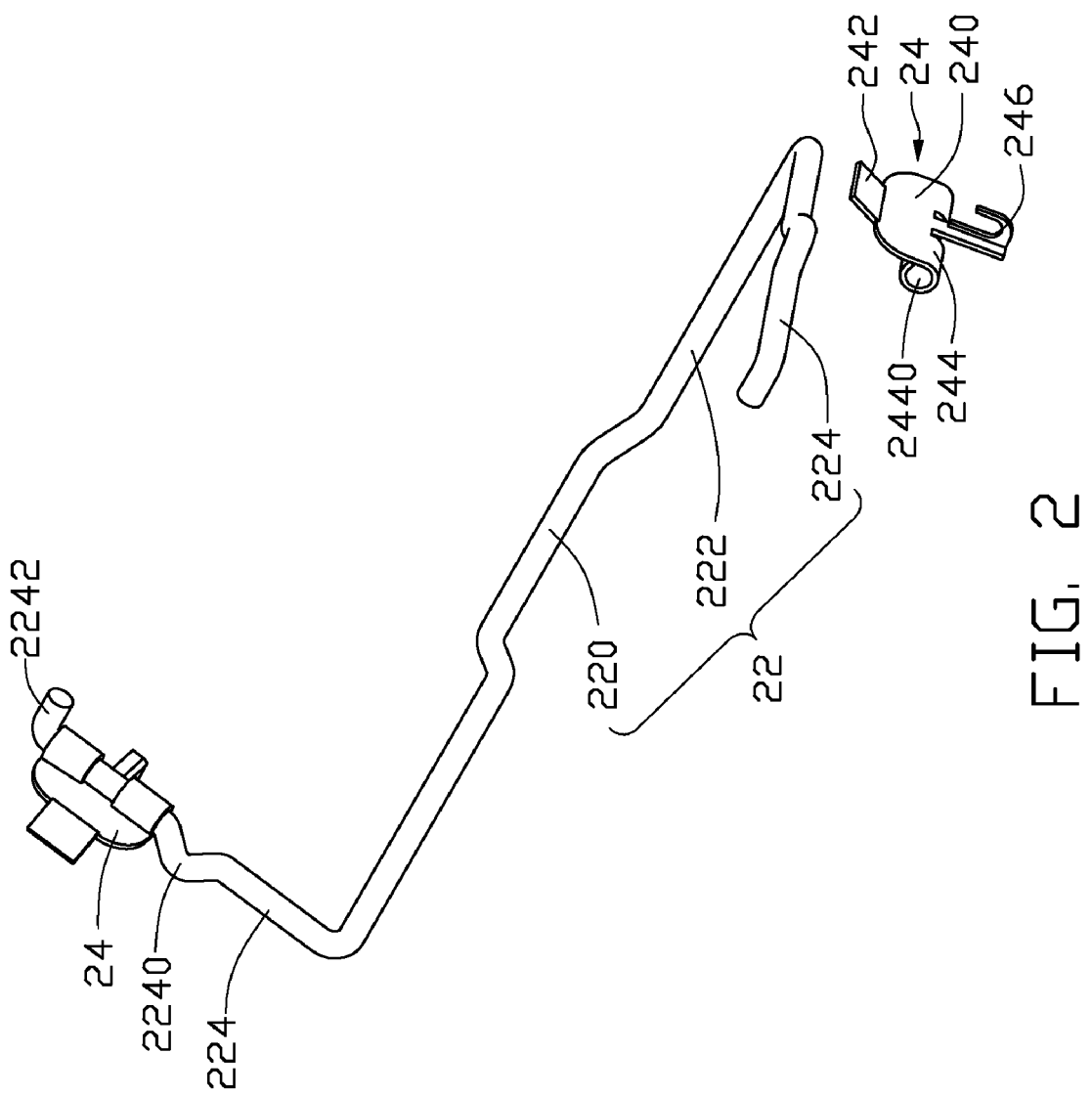
FIG. 2 is an isometric, partly exploded view of a clip assembly of the heat sink assembly of FIG. 1.
Figure 3:
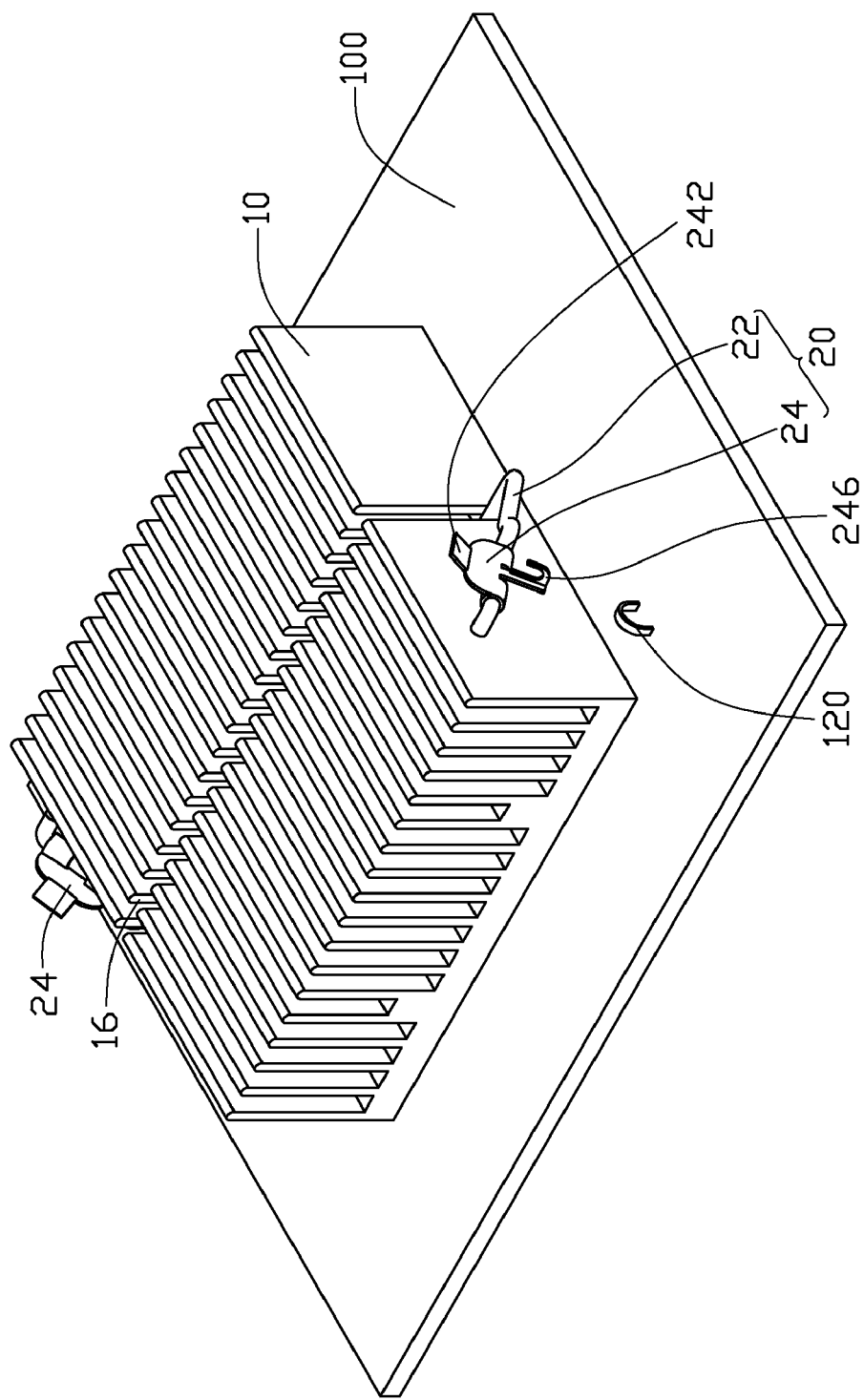
FIG. 3 is an isometric, assembled view of the heat sink assembly of FIG. 1 mounted on a printed circuit board, with the clip assembly at an unlocked position.
Figure 4:
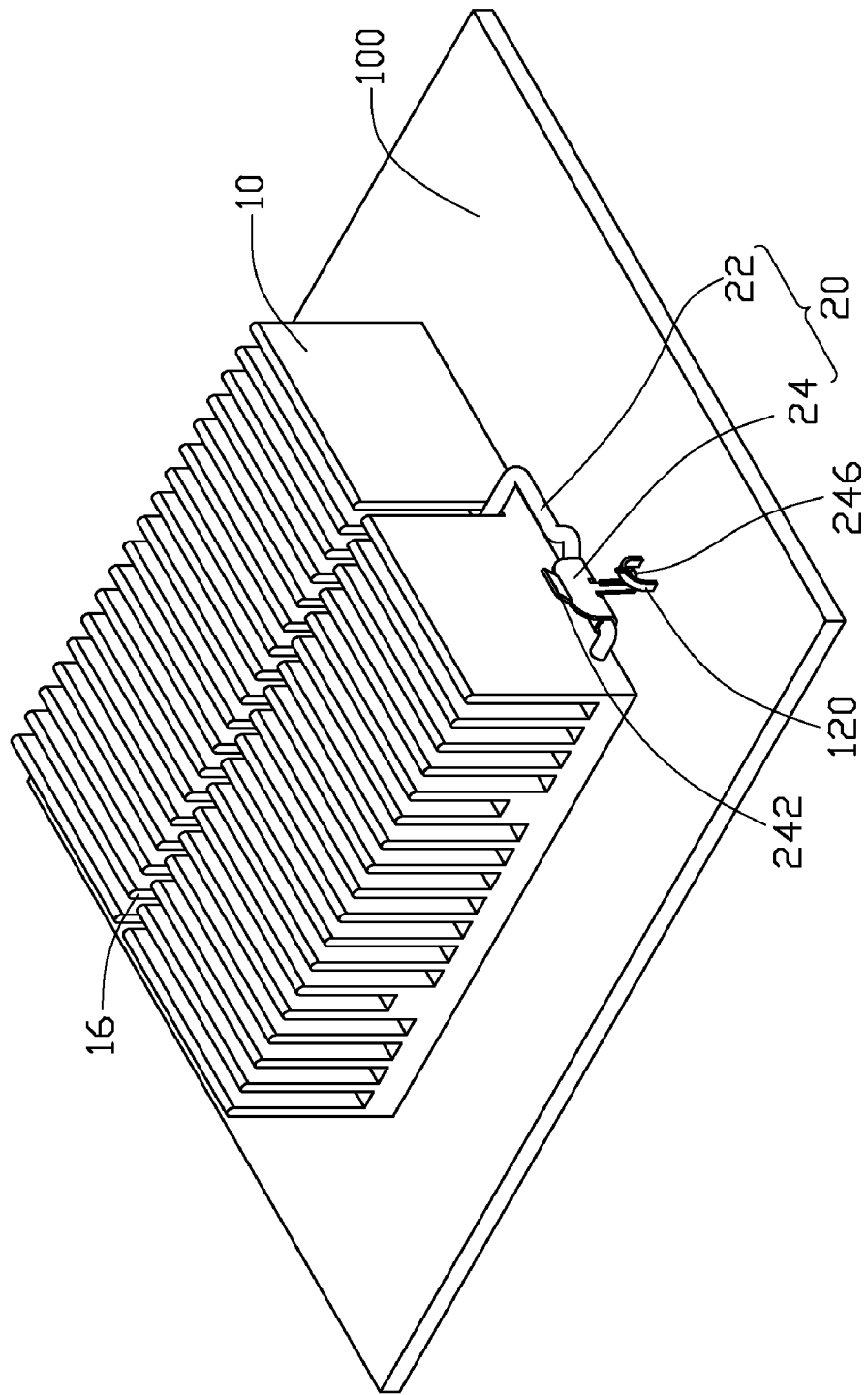
FIG. 4 is an isometric, assembled view of FIG. 3, with the clip assembly moved to a locked position and engaging with clasps formed on the printed circuit board.

Referring to FIGS. 1-4, a heat sink assembly, which is used for dissipating heat generated from an electronic element (not shown) on a printed circuit board 100, comprises a heat sink 10 and a clip assembly 20. The clip assembly 20 is used to engage with clasps 120 (only one shown) formed on the printed circuit board 100 and located near two diagonally opposite corners of the heat sink 10 to secure the heat sink 10 onto the printed circuit board 100, whereby the heat sink 10 can have an intimate contact with the electronic element. In the preferred embodiment, the electronic element is a CPU or a chip set.

The heat sink 10 is integrally made of metal with a high heat conductivity such as copper, aluminum or an alloy thereof. The heat sink 10 comprises a rectangular base 12 and a plurality of fins 14 extending upwardly from a top surface of the base 12. The fins 14 are parallel to each other. A channel (not labeled) is defined between every two adjacent fins 14. A straight groove 16 is lengthwise defined in a middle of the fins 14 of the heat sink 10, traverse with the channels, for receiving the clip assembly 20 therein.

The clip assembly 20 comprises a wire clip 22 which is integrally made of a resilient metal wire and a pair of movable fasteners 24 rotatably connecting with two opposite ends of the clip 22. The clip 22 comprises a main body 220, a pair of pressing portions 222 extending horizontally from two opposite lower ends of the main body 220 along opposite directions and two locking arms 224 extending perpendicularly and oppositely from the pressing portions 222, respectively. The main body 220 and pressing portions 222 cooperatively have a length slightly larger than a width of the base 12 of the heat sink 10 and a length of the groove 16. The pressing portions 222 extend horizontally from the two opposite ends of the main body 220 and are parallel with the main body 220. The pressing portions 222 are symmetric to the main body 220. The pressing portions 222 are at a level lower than that of the main body 220. The locking arms 224 extend slantwise, upwardly from two ends of the pressing portions 222 along opposite directions, respectively, and inclined to the base 12 of the heat sink 10. The locking arms 224 are oriented perpendicular to the main body 220 and the pressing portions 222. The locking arms 224 each comprise a blocking portion 2240 curved outwardly at a middle portion thereof and a hooked portion 2242 formed at a distal end thereof. The hooked portion 2242 is curved inwardly towards the main body 220 of the clip 22. The blocking portion 2240 cooperates with the hooked portion 2242 to sandwich a corresponding movable fastener 24 therebetween and prevent the corresponding movable fastener 24 from a movement along the locking arm 224 of the clip 22.

The movable fasteners 24 are rotatably connected with the locking arms 224 of the clip 22, respectively. The movable fasteners 24 each are formed by stamping a metal sheet and comprise a main body 240. A handle 242 extends upwardly and outwardly from an upper end of the main body 240, for an assembler to manipulate the movable fastener 24 in order to fasten the heat sink 10 to the printed circuit board 100. A pair of receiving portions 244 are curved upwardly and then inwardly from a lower end the main body 240, which is opposite to the upper end thereof. The receiving portions 244 are spaced from each other and each define a receiving hole 2440 for receiving a corresponding locking arm 224 therein. A J-shaped hook 246 extends downwardly from the lower end of the main body 240 and is located below the receiving portions 244 and at an opposite side of the receiving portions 244 in respect to the main body 240. The two receiving portions 244 are located at two opposite sides of the hook 246. The hooks 246 are used to lock with the clasps 120 attached on a top surface of the printed circuit board 100 and located near the diagonally opposite corners of the heat sink 10 to firmly secure the heat sink 10 onto the printed circuit board 100.

Before assembly of the wire clip 22 and the movable fasteners 24 of the clip assembly 20 together, the locking arms 224 of the clip 22 are straight, for facilitating the locking arms 224 to extend through the receiving holes 2440 of the receiving portions 244. Parts of the locking arms 224 are pivotally received in the receiving holes 2440 of the receiving portions 244 so that the movable fasteners 24 are ratatably connected to the locking arms 224 of the clip 22. For preventing the movable fasteners 24 from separating from the locking arms 224, the blocking portions 2240 and the hooked portions 2242 of the locking arms 224 are formed by bending corresponding portions of the locking arms 224 after the parts of the locking arms 224 extend through the receiving holes 2440 of the receiving portions 244 of the movable fasteners 24, whereby the blocking portions 2240 cooperate with the hooked portions 2242 to prevent the movable fasteners 24 from separating from and linearly moving along the locking arms 224. The movable fasteners 24 are pivotally connected to the locking arms 224 of the clip 22 in such a manner that the movable fasteners 24 are capable of accurately and easily engaging with the clasps 120.

In assembly, the main body 220 and the pressing portions 222 of the clip 22 are fitly received in the groove 16 of the heat sink 10, with the locking arms 224 being located adjacent and parallel to opposite front and rear sides of the heat sink 10. The movable fasteners 24 rotatably connected to the locking arms 224 are also located near the front and rear sides of the heat sink 10, with the receiving portions 244 of the movable fasteners 24 facing the fins 14 of the heat sink 10 and the hooks 246 of the movable fastener 24 facing the clasps 120 of the printed circuit board 100. Then, a force is applied on the handles 242 of the movable fasteners 24 to press downwardly the locking arms 224 towards the base 12 of the heat sink 10 in such a manner that the movable fasteners 24 are rotated around the locking arms 224 to cause the hooks 246 to move close to the front and rear sides of the heat sink 10, thereby enlarging a distance from each of distal ends of the hooks 246 to a corresponding clasp 120. Then, when the locking arms 244 are pressed downwards to reach a required position, a force is applied on the handles 242 of the movable fasteners 24 to rotate the movable fasteners 24 in such a manner that the distal ends of the hooks 246 are moved into clasps 120. Meanwhile, the down pressing force on the locking arms 224 is released and the hooks 246 are locked with the clasps 120 on the printed circuit board 100 to firmly secure the heat sink 10 to the printed circuit board 100. Thus, the heat sink 10 is intimately engaged with the electronic component.

In the present invention, as the movable fasteners 24 are pivotally connected to the locking arms 224 of the clip 22, the distances from the distal ends of the hooks 246 of the movable fastener 24 to the clasps 120 of the printed circuit board 100 can be adjusted by the rotation of the movable fasteners 24, which can facilitate the hooks 246 to be easily and accurately locked with the clasps 120 of the printed circuit board 100. In addition, by the pivotably movable fasteners 24, the clip assembly 20 can easily disengage from the clasps 120, which is very advantageous in view of test and maintenance.

It is believed that the present embodiments and their advantages will be understood from the foregoing description, and it will be apparent that various changes may be made thereto without departing from the spirit and scope of the invention or sacrificing all of its material advantages, the examples hereinbefore described merely being preferred or exemplary embodiments of the invention.

What is claimed is:

1. A heat sink assembly adapted for dissipating heat generated by an electronic component mounted on a printed circuit board, the heat sink assembly comprising:
   a heat sink comprising a base and a plurality of fins extending from a top surface of the base; and
   a clip assembly adapted for resiliently clamping the heat sink on the electronic component, the clip assembly comprising:
   a clip comprising a pair of pressing portions abutting against the top surface of the base, and two locking arms extending upwardly from two ends of the pressing portions and located adjacent to two opposite sides of the heat sink, the locking arms being perpendicular to the pressing portions; and
   two movable fasteners pivotally connected to the locking arms of the clip, respectively, the movable fasteners each comprising a main body, a receiving portion curved upwardly from a free end of the main body and defining a receiving hole therein, and a hook extending downwardly from the free end of the main body, adapted for engaging with the printed circuit board to resiliently clamp the heat sink on the electronic component, the locking arms being pivotally received in the receiving holes of the receiving portions of the two movable fasteners, respectively;
   wherein the hooks of the movable fasteners can be rotated around the locking arms of the clip so that a distance from the hooks to clasps formed on the printed circuit board is adjustable via rotation of the movable fasteners around the locking arms of the clip to thereby facilitate the hooks to engage with the clasps of the printed circuit board.

2. The heat sink assembly as claimed in claim 1, wherein each of the hooks has a J-shaped configuration.

3. The heat sink assembly as claimed in claim 2, wherein each of the movable fasteners comprises a handle extending from another free end opposite to the free end of the main body thereof, and adapted for receiving a force for rotating the each of the movable fasteners.

4. The heat sink assembly as claimed in claim 1, wherein the clip is made of a spring wire.

5. The heat sink assembly as claimed in claim 1, wherein the movable fasteners each are formed by stamping a metal sheet.

6. The heat sink assembly as claimed in claim 5, wherein the receiving portion of each of the movable fasteners comprises a pair of receiving portions spaced from each other, and a corresponding hook is located between the pair of the receiving portions.

7. The heat sink assembly as claimed in claim 1, wherein the locking arms of the clip each comprise a blocking portion at a middle portion thereof and a hooked portion at a distal end thereof, and each of the movable fasteners is sandwiched between a corresponding blocking portion and a corresponding hooked portion.

8. The heat sink assembly as claimed in claim 1, wherein the fins of the heat sink are parallel to each other, a groove being defined in a middle of fins for receiving the main body and the pressing portions of the clip.

9. A clip assembly adapted for securing a heat sink to a printed circuit board, the heat sink being adapted for dissipating heat generated by an electronic component on the printed circuit board, the clip assembly comprising:

a wire clip having a middle portion adapted for pressing the heat sink toward the printed circuit board and two locking arms extending from two ends of the middle portion toward different directions; and a pair of fasteners pivotably mounted to the locking arms, respectively, wherein the fasteners each form a hook adapted for engaging with a clasp formed on the printed circuit board, wherein each of the fasteners has a handle adapted for receiving a force for rotating a corresponding hook.

10. The clip assembly as claimed in claim 9, wherein the each of the fasteners has a main body having a lower end, and a curved receiving portion extending upwardly from the lower end of the main body, a corresponding locking arm extending through the curved receiving portion, and the corresponding hook extending downward from the lower end of the main body and located below the receiving portion.

11. The clip assembly as claimed in claim 10, wherein the corresponding hook and the curved receiving portion are located at two opposite sides of the main body.

* * * * *